United States Patent [19]

Khan

[11] Patent Number: 5,352,934

[45] Date of Patent: Oct. 4, 1994

[54] INTEGRATED MOSFET RESISTANCE AND OSCILLATOR FREQUENCY CONTROL AND TRIM METHODS AND APPARATUS

[75] Inventor: Sakhawat Khan, Santa Clara, Calif.

[73] Assignee: Information Storage Devices, Inc., San Jose, Calif.

[21] Appl. No.: 38,355

[22] Filed: Mar. 25, 1993

Related U.S. Application Data

[60] Division of Ser. No. 940,764, Sep. 4, 1992, Pat. No. 5,243,239, which is a continuation of Ser. No. 644,033, Jan. 22, 1991, abandoned.

[51] Int. Cl.$^5$ .......................... H03M 1/66; G05F 3/16
[52] U.S. Cl. ............................. 307/296.1; 307/296.8; 323/315; 323/317; 341/144
[58] Field of Search .................. 307/270, 296.1, 296.6, 307/296.8; 341/144; 323/315, 316

[56] References Cited

U.S. PATENT DOCUMENTS

| | | | |
|---|---|---|---|
| 4,608,530 | 8/1986 | Bacrania | 323/315 |
| 4,701,694 | 10/1987 | Penney et al. | 323/317 |
| 4,712,091 | 12/1987 | Schoofs et al. | 323/317 |
| 4,827,260 | 5/1989 | Sugawa et al. | 341/144 |
| 4,874,964 | 10/1989 | Kondo | 307/270 |
| 4,914,317 | 4/1990 | Agiman | 307/270 |

*Primary Examiner*—Timothy P. Callahan
*Attorney, Agent, or Firm*—Blakely, Sokoloff, Taylor & Zafman

[57] ABSTRACT

For use in integrated circuit systems wherein both filter time constants and oscillator frequency each need a suitable reference, both the filter and the oscillator are referenced to common reference circuitry through a suitable control loop. Because the fundamental control parameters of the oscillator and the filter are time-period and time-constant respectively, the oscillator and the filter are implemented in a manner where the monolithic passive elements setting the fundamental control parameters (time-period and time-constant) are of the same type. This has the advantage of close tracking through process and ambient variations. Monolithic capacitors on the same chip are used as one of the common passive elements between the oscillator and the filter to set the time-period and time-constants, respectively, adjustable through adjustment of control currents. The monolithic implementation of the Control Block is such that by tuning the oscillator frequency to the appropriate value through setting of the respective control current, the filter time-constants also are appropriately set to satisfy the Nyquist criteria for a sampling rate referenced to the oscillator frequency. Trimming and tuning are accomplished by digital control to control the summing of appropriate current components after manufacture, such as by the programming of on-chip storage cells provided for this purpose.

14 Claims, 12 Drawing Sheets

5,352,934

INTEGRATED MOSFET RESISTANCE AND OSCILLATOR FREQUENCY CONTROL AND TRIM METHODS AND APPARATUS

This is a divisional of application Ser. No. 07/940,764, filed Sep. 4, 1992, now U.S. Pat. No. 5,243,239 which was a continuation of application Ser. No. 07/644,033, filed Jan. 22, 1991, now abandoned, for an "INTEGRATED MOSFET RESISTANCE FREQUENCY CONTROL OSCILLATOR".

BACKGROUND OF THE INVENTION

1. Field of the Invention

The present invention relates to the field of integrated circuit design, and more particularly to integrated circuits having on-chip, one or more oscillators and/or resistance dependent circuits such as MOSFET resistance dependent circuits.

2. Prior Art

In a Sample Data System, there is always the need to band limit the incoming analog signal and sample it periodically. Band-limiting of the analog signal is performed through a suitable lowpass or a bandpass filter, and the periodic sampling is performed by sampling circuitry with an accurate periodic time-base. The periodic time base is generated from a suitable oscillator.

One form of monolithic implementation of a suitable filter is the continuous time active MOSFET-RC type. In an MOSFET-RC filter, MOSFET transistors are used in the non-saturation region with a control voltage on the gate to generate an effective resistance. Processing tolerances of integrated MOSFET transistor and capacitor parameters may create ±50% variation in the filter time constants. To maintain tight tolerances on the filter time constants, it becomes necessary to have a control loop, referenced to a stable reference, to control the time constants of the filter over process and ambient changes. In implementations where the time-base oscillator is also specified to be implemented in a monolithic form with the filter, the same process tolerances will create ±50% variations on the oscillator frequency. To achieve an accurate and stable oscillation frequency, the oscillator also needs to be referenced to a stable and accurate reference. The present invention provides a simple and unique way of achieving these ends in a monolithic device.

In prior art situations where it is necessary to have a trimmed current-to-voltage transfer function (T=V/I), most implementations develop a voltage Vo across a trimming resistor Rt by passing a current I through the resistor. By trimming the resistor Rt, an accurate voltage Vo is developed or an accurate current to voltage transfer function is achieved. FIG. 1 shows a general implementation scheme. In integrated circuit implementations, the trimming resistor Rt may be formed as a series or parallel combination of multiple resistors with switches, as shown in FIG. 2a and FIG. 2b, respectively, or a single resistor may be used where trimming is performed through laser cutting as shown in FIG. 2c. The switches may be active or passive. Active switches may either be bipolar or MOS transistors or zener diodes. Passive switches may each just be a thin interconnect line, such as metal.

When MOS transistors are used as switches, a fair amount of silicon area is used up because large MOS switches need to be made to have their turn-on resistance small compared to the trim resistor, as otherwise, trimming is not accurate. Bipolar switches have an inherent turn-on voltage Vsat, whereby they are non-ideal switches and hence create inaccurate trimming. Zener zapping and laser trimming are clumsy and expensive because of the sophisticated external hardware that is required. Both zener zapping and laser trimming have long term reliability problems, and are not reprogrammable.

BRIEF SUMMARY OF THE INVENTION

For use in integrated circuit systems wherein both filter time constants and oscillator frequency each need a suitable reference, both the filter and the oscillator are referenced to common reference circuitry through a suitable control loop. Because the fundamental control parameters of the oscillator and the filter are time-period and time-constant respectively, the oscillator and the filter are implemented in a manner where the monolithic passive elements setting the fundamental control parameters (time-period and time-constant) are of the same type. This has the advantage of close tracking through process and ambient variations. Monolithic capacitors on the same chip are used as one of the common passive elements between the oscillator and the filter to set the time-period and time-constants, respectively, adjustable through adjustment of control currents. The monolithic implementation of the Control Block is such that by tuning the oscillator frequency to the appropriate value through setting of the respective control current, the filter time-constants also are appropriately set to satisfy the Nyquist criteria for a sampling rate referenced to the oscillator frequency. Trimming and tuning are accomplished by digital control to control the summing of appropriate current components after manufacture, such as by the programming of on-chip storage cells provided for this purpose.

DETAILED DESCRIPTION OF THE INVENTION

Figure 8:
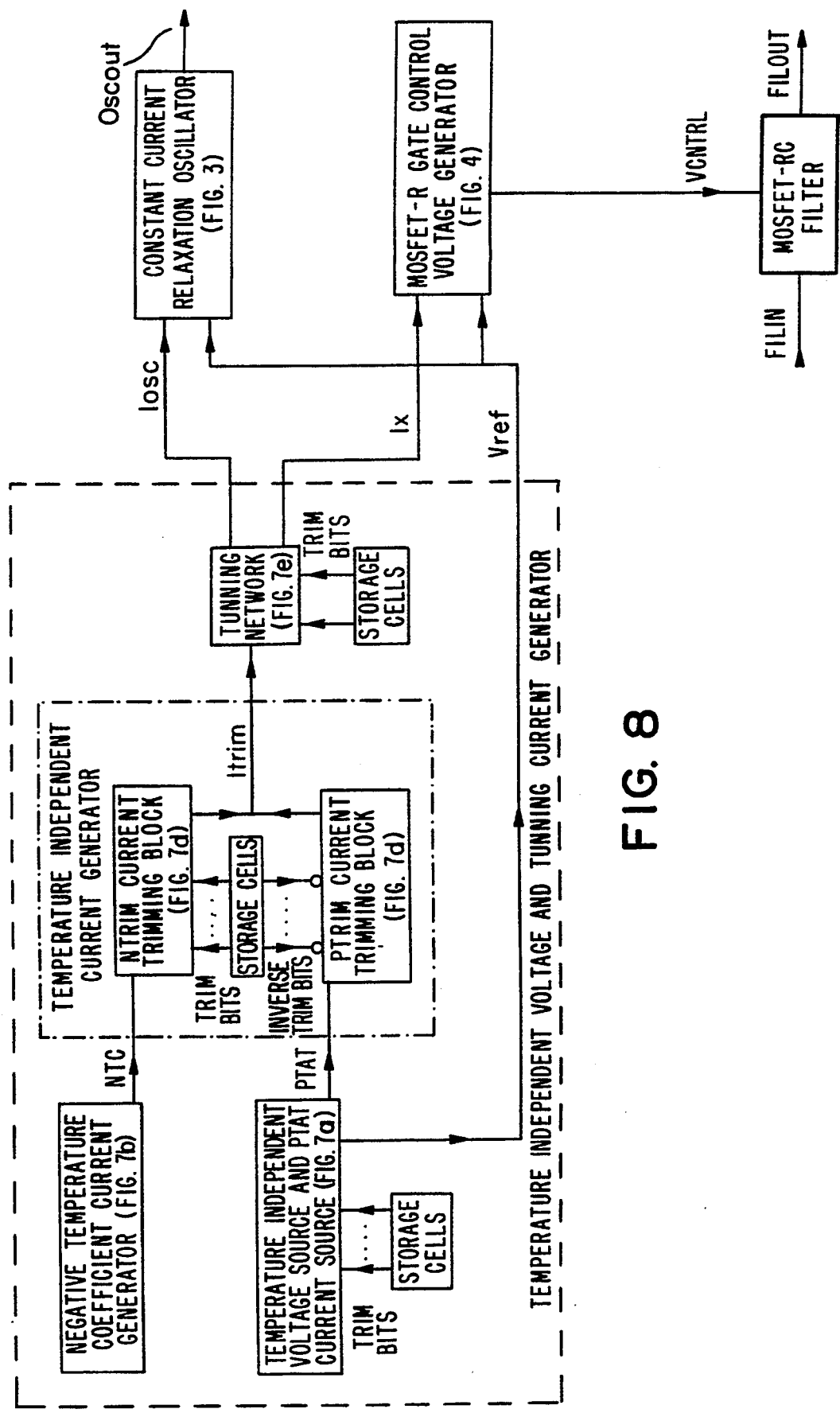
FIG. 8 is a block diagram illustrating the interconnection of the circuits of FIGS. 3, 4, 7a, 7b, 7d and 7e.

In certain systems such as sampled data systems, both the filter time constants and the oscillator frequency used to generate the sampling frequency each need a suitable reference. In accordance with the present invention, both the filter and the oscillator are referenced to common reference circuitry through a suitable control loop. Because the fundamental control parameters of the oscillator and the filter are time-period and time-constant respectively, both being derivatives of time, the oscillator and the filter are implemented in a manner where the monolithic passive elements setting the fundamental control parameters (time-period and time-constant) are of the same type and construction. This has the advantage of closer tracking through process and ambient variations. In the present implementation, the monolithic capacitor is used as one of the common passive elements between the oscillator and the filter to set the time-period and time-constants, respectively. The monolithic implementation of the Control Block is such that by tuning the oscillator frequency to the appropriate value, the filter time-constants also get appropriately set. The Control Block essentially consists of three distinct sub-blocks:

a) Constant Current Relaxation Oscillator
b) MOSFET-R Gate Control Voltage Generator
c) Temperature Independent Voltage and Tuning Current Generator In the description of detailed circuits to follow, it may be convenient to also refer to FIG. 8, which shows in block diagram form the interconnection of the detailed circuits.

The Constant Current Relaxation Oscillator

Figure 1:
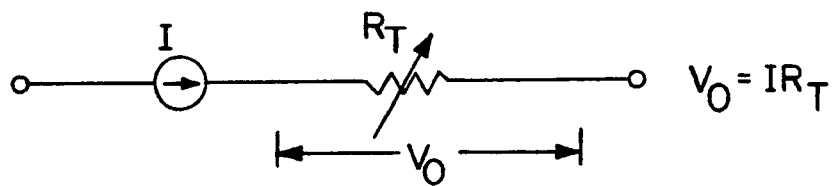
FIG. 1 is a general schematic representation of the use of a trimmable resistor to obtain an accurate Vo or an accurate current to voltage transfer function in the prior art.
Figure 2A:
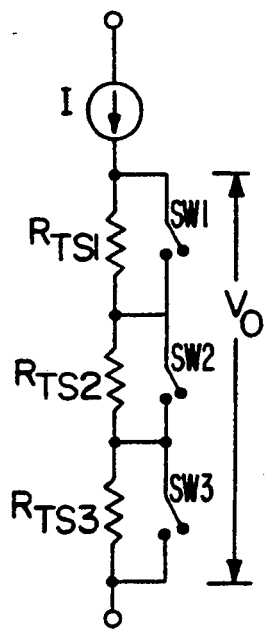
FIG. 2a through 2c are general schematic representations of forms of trimmable resistors to obtain an accurate Vo or an accurate current to voltage transfer function in the prior art, namely a series and a parallel combination of resistors with switches, and a single resistor for laser trimming, respectively.
Figure 2B:
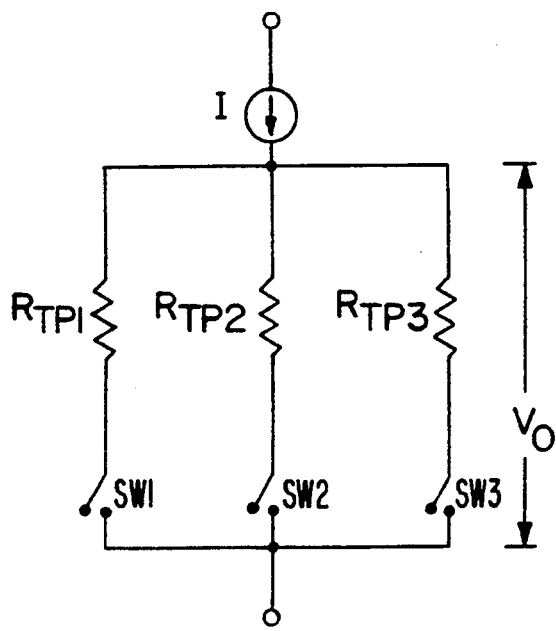
Figure 2C:
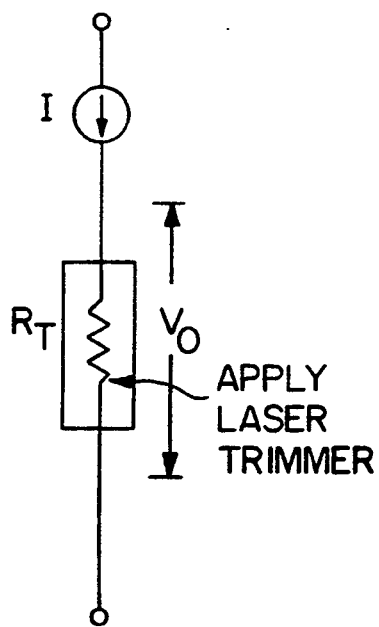
Figure 3:
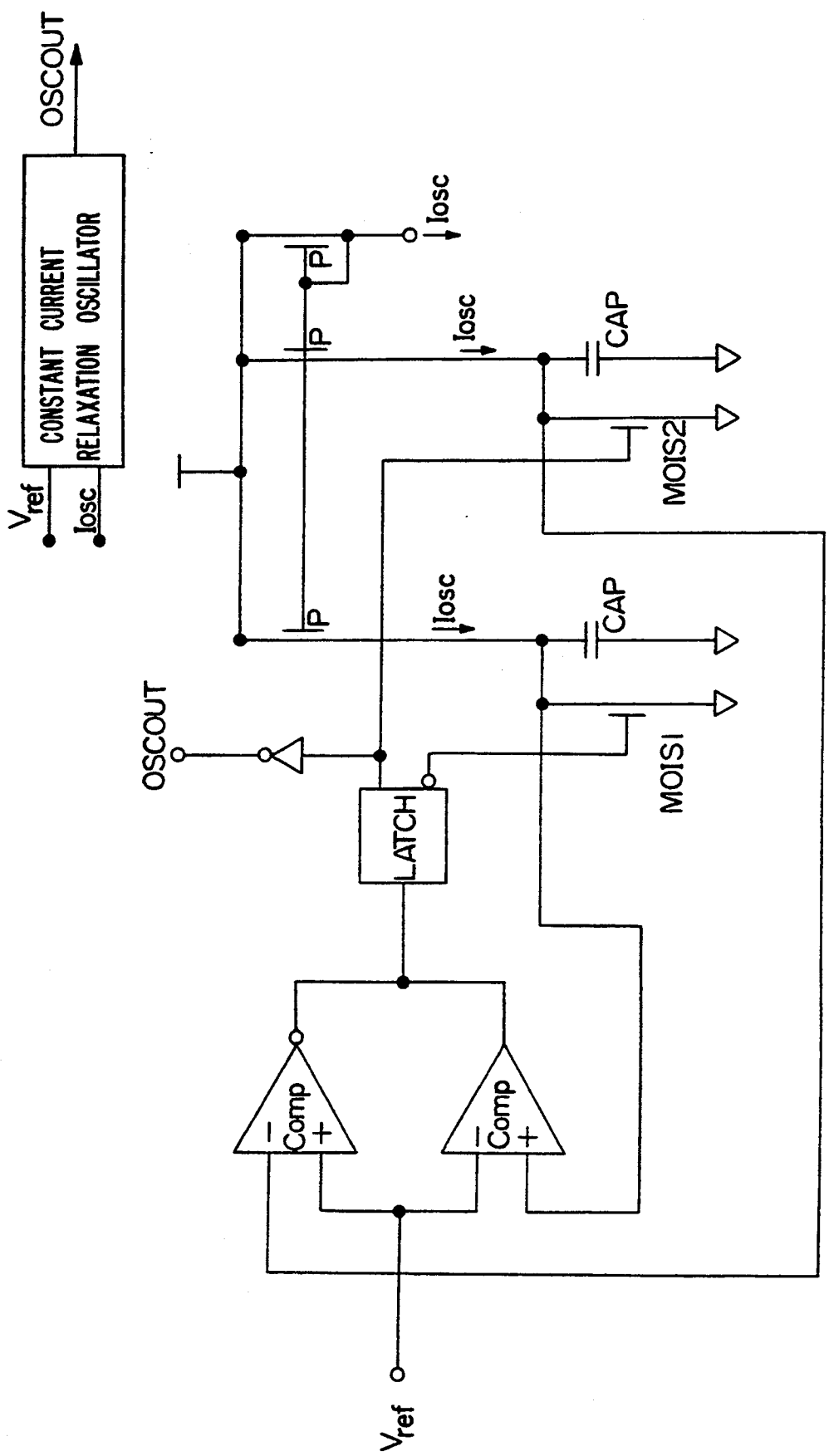
FIG. 3 is a circuit diagram for the constant current relaxation oscillator used in the preferred embodiment of the present invention.

Referring to FIG. 3, this oscillator operates on the principle that a pair of capacitors are alternately charged (each from a discharged state) through a constant current (Iosc) to a certain fixed voltage (Vref). When one of the capacitors reaches Vref, a comparator detects the condition and then turns on the discharge circuitry for this capacitor. At the same time the other capacitor is released from the discharged state to charge up to Vref. The alternating periodic charging and discharging of the pair of capacitors gives the behavior of an oscillator. The advantage of using a pair of alternating capacitors is that the discharge times of the capacitors do not come into the time-period equation and hence non-critical capacitor discharge circuitry can be used, thereby reducing silicon area required.

The basic equation governing the operation of the oscillator is:

$$Tosc = A \frac{Cap * Vref}{Iosc} \quad \text{(Eq-1)}$$

Where:
- Tosc = Time-period of oscillation
- A = constant of proportionality, (depends on circuit design)
- Vref = Fixed voltage to which capacitors charge.
- Iosc = Constant current through capacitors to get charged to Vref
- Cap = Capacitor value (each capacitor).

The above equation can also be written in terms of frequency.

$$Fosc = B \frac{Iosc}{Cap * Vref} \quad \text{(Eq-2)}$$

$(B = 1/A)$

The MOSFET-R Gate Control Voltage Generator

The purpose of the control loop is to generate a voltage that could be applied to all the gates of the filter MOSFET-Rs so that the MOSFETs will exhibit the desired resistance between the sources and drains thereof dependent on the geometry of the MOSFETs. The control loop itself consists of a reference MOSFET-R which is placed in the proper dc operating environment. All the filter MOSFET-Rs are ratioed to this reference MOSFET-R through ratios of their respective channel lengths to that of the reference MOSFET-R channel length, such that the proper effective resistance is generated, which in turn, combining with the filter capacitors, set the proper filter time-constants. If there are variations due to ambient changes such as power supply and temperature, the control loop automatically changes the gate voltage (VCNTRL) to keep the effective resistance of the MOSFET-Rs fixed.

Figure 4:
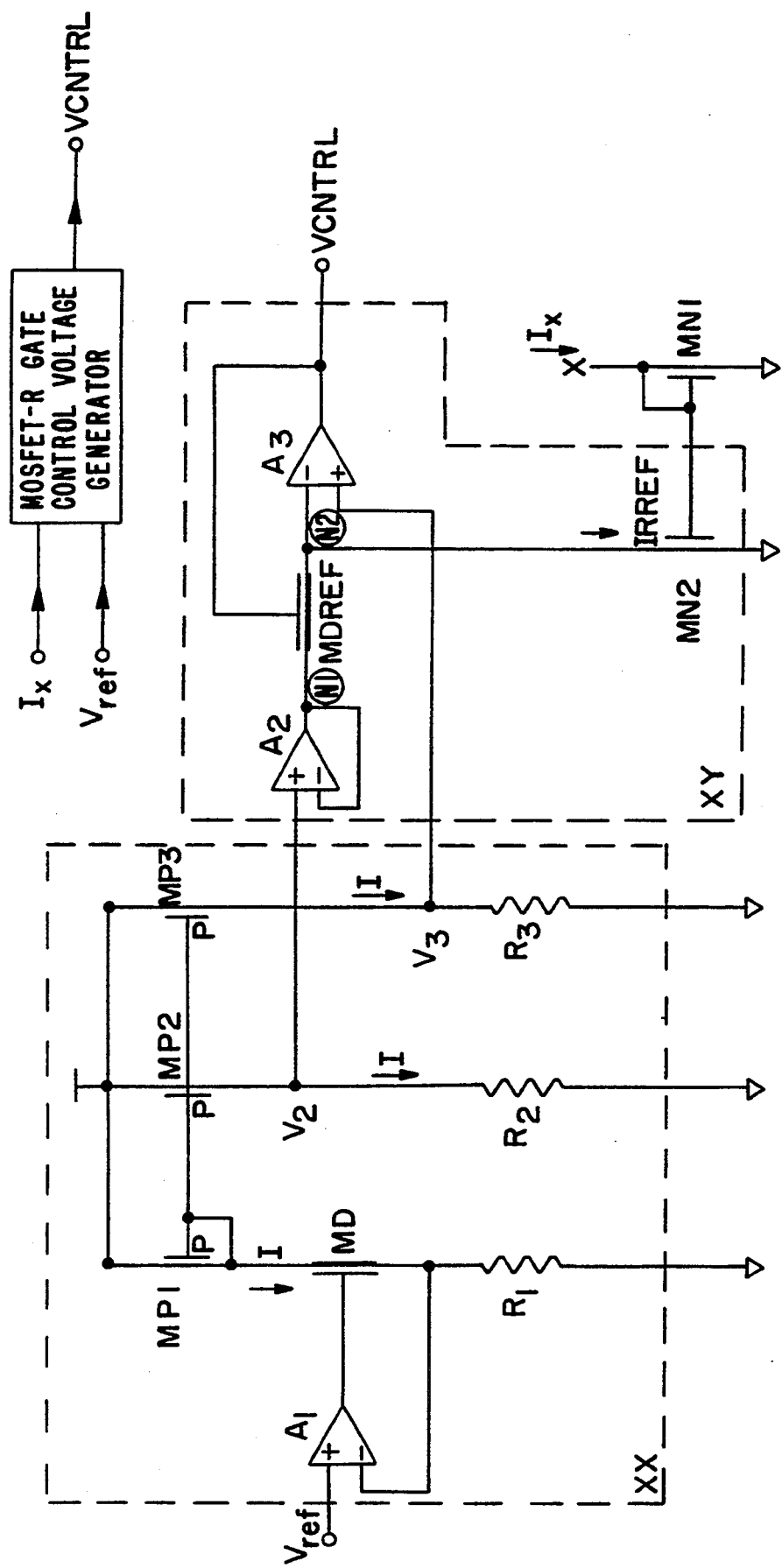
FIG. 4 is a circuit diagram for the MOSFET-R gate control voltage generator used in the preferred embodiment of the present invention.

Referring to FIG. 4, the dotted block XX effectively generates voltages V2 and V3, which are ratioed off the fixed voltage Vref. The voltage to current generator consisting of amplifier A1, transistor MD (preferably a zero threshold device), resistor R1 and diode connected p-channel device MP1, creates a current I flowing through MP1 given by the relation I=Vref/R1. The current I, mirrored by p-channel devices MP2 and MP3, is made to flow through resistors R2 and R3, respectively, to generate voltages V2 and V3 respectively, given by the relations V2=IR2 and V3=IR3, respectively. Replacement of I in the V2, V3 relations gives V2=Vref (R2/R1) and V3=Vref(R3/R1). It is noticed that V2, V3 are ratioed to Vref, through the resistor ratios R2/R1 and R3/R1 respectively, which in a monolithic implementation are accurately generated. The dotted block XY is the control loop, consisting of voltage buffer A2, reference MOSFET-R MDREF, loop amplifier A3 and mirror n-channel transistor MN2. Voltage V2 is applied to node N1 of MDREF through the voltage buffer A2. The voltage output V2 is isolated from node N1 by the buffer A2. Voltage V3 is applied to the noninverting input of the loop amplifier A3, and through the high gain of A3 gets virtually applied to node N2 of MDREF. Thus a voltage difference Vp=V2−V3 is applied across MDREF. V2 and V3 are such that they place MDREF in the normal operating environment (voltage range) of the filter MOSFET-Rs, and Vp is the maximum signal level that the filter MOS- FETs will see across them. It is important to have the normal operating environment setup because MOSFET-Rs are non-linear active devices and thus have different characteristics at different operating points. This essentially creates an accurate referencing scheme. The transistor MN2 pulls a current IRREF through MDREF. The action of the loop is such that the amplifier sets the voltage VCNTRL to hold the relationship:

$$Reff = VP/IRREF. \qquad (3)$$

Where: Reff=the effective resistance of MDREF.

All filter MOSFET-R effective resistances are ratios of Reff.

The filter time-constant equation can be written as:

$$Trc = Vp*Cap/IRREF = (Vref*Cap/IRREF)*R2/R1*(1-R3/R2) = M*(Vref*Cap/IRREF) \qquad (4)$$

Also:

$$Reff = M*(Vref/IRREF) \qquad (5)$$

From equations 1 through 4, it is seen that both Tosc and Trc are inversely proportional to a current parameter. Hence it is possible to have the currents Iosc and IRREF ratioed from a common trimmable current Itrim. The frequency of the oscillator may be observed and the Itrim changed accordingly to set the oscillation frequency. This would automatically set the filter time-constants and tune the filter for the proper cutoff characteristics. Once tuned, Tosc and Trc must remain stable over ambient changes such as power supply variations and temperature variations. The constants of proportionality (A,M) are ratios of identical components, and capacitors once fabricated have very tight tolerance to ambient changes. Only Vref and the currents Iosc and IRREF have to be tolerant to temperature and power supply variations. This means that Vref, Iosc and IRREF should be temperature and power supply independent.

Temperature Independent Voltage and Tuning Current Generator

The temperature independent voltage Vref is generated from a band-gap circuit with high power supply rejection ratio. A PTAT (proportional to absolute temperature) current is derived from the band-gap circuit, and is added to a current with a negative temperature coefficient (NTC). With a proper ratio of the PTAT and the NTC currents, a temperature independent current (Itrim) is generated. Itrim is passed through a tuning network which generates the currents Ix and Iosc. Since Ix and Iosc are ratioed to Itrim, they are also temperature independent.

Combining equation 5 and equation 1:

$$Fosc = \frac{B*M*Iosc}{IRREF} * \frac{1}{Reff*Cap} = \frac{Y}{Reff*Cap}$$

Or, $$Tosc = Z * (Reff * Cap)$$

Figure 5:
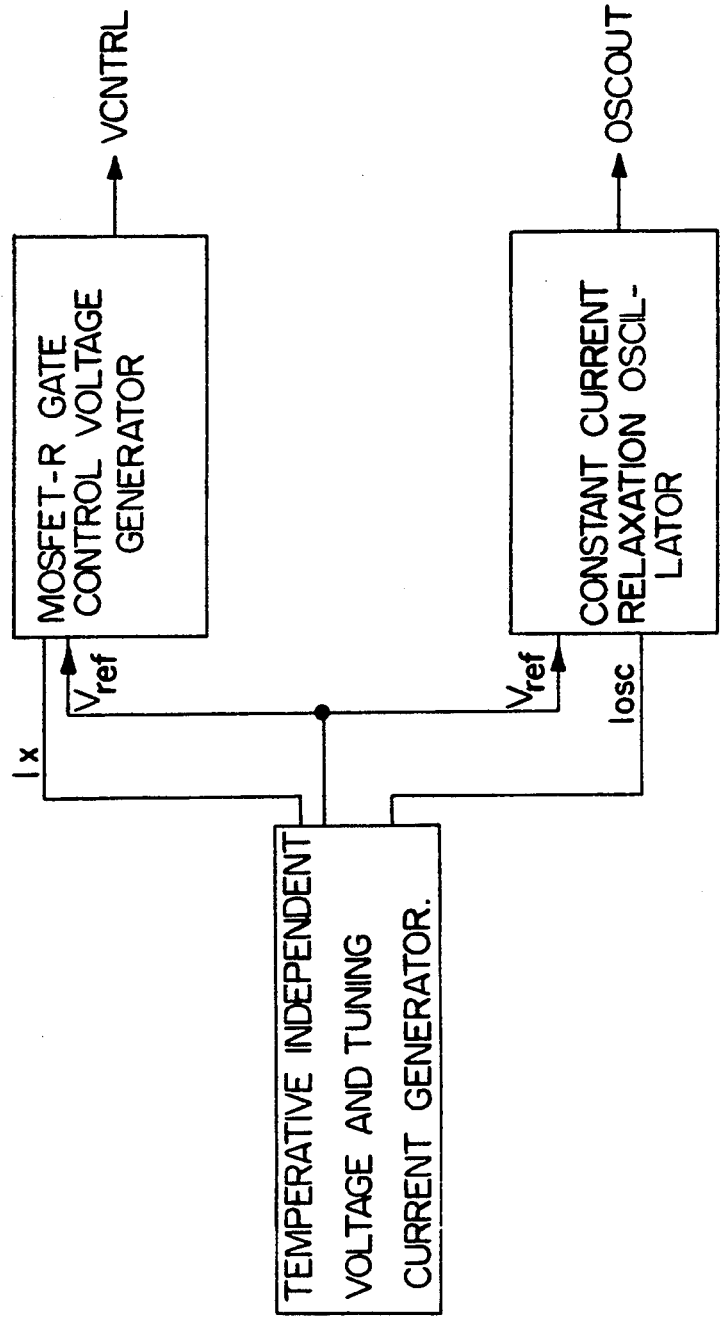
FIG. 5 is a block diagram for the MOSFET-R and oscillator-F control block used in the preferred embodiment of the present invention.
Figure 6:
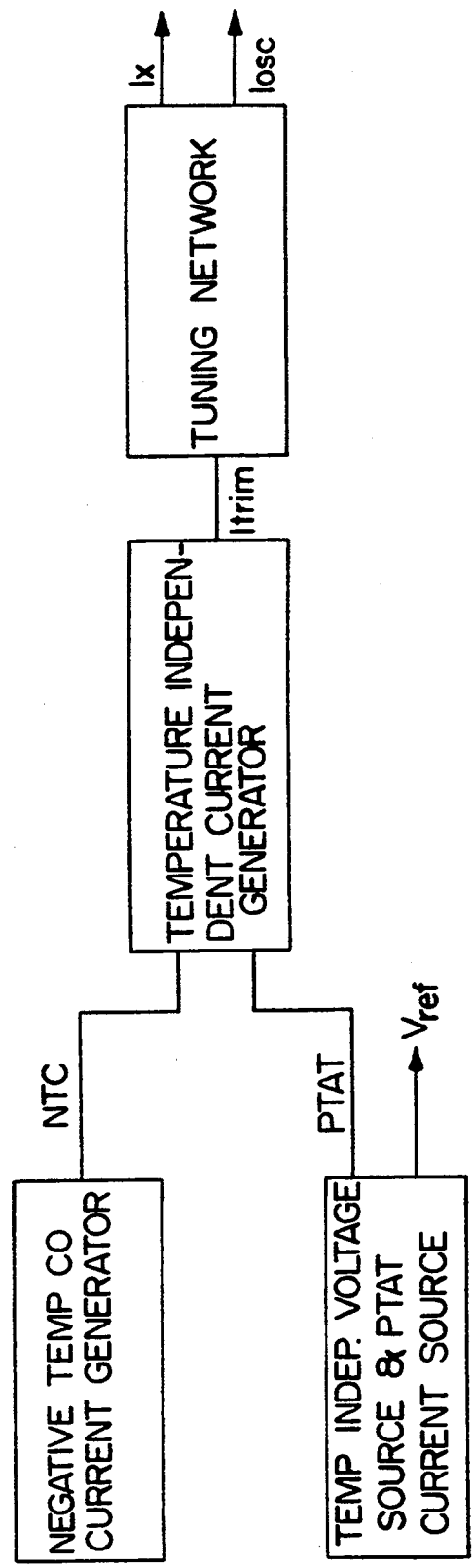
FIG. 6 is a block diagram for the temperature independent voltage and tuning current generator used in the preferred embodiment of the present invention.

It may be seen from FIGS. 3 and 4 and the description thereof that the constant current relaxation oscillator of FIG. 3 utilizes as its inputs a fixed reference voltage Vref and a control current Iosc for direct control of the frequency of oscillator, and that the MOSFET-R gate control generator of FIG. 4 utilizes as its inputs the same reference voltage Vref as well as the control current Ix. This reference voltage Vref as well as the control currents Ix and Iosc are generated by a temperature independent voltage and tuning current generator illustrated in block diagram form in FIG. 5. Various sub-blocks making up the temperature independent voltage and tuning current generator illustrated in FIG. 5 are shown in FIG. 6. As shown therein, temperature independent voltage source and PTAT current source generates the reference voltage Vref as well as a current proportional to absolute temperature (PTAT). This, together with a negative temperature coefficient (NTC) current provided by the negative temperature coefficient current generator are provided to a temperature independent current generator, which in turn provides a current Itrim to a tuning network which provides the currents Ix and Iosc.

Figure 7A:
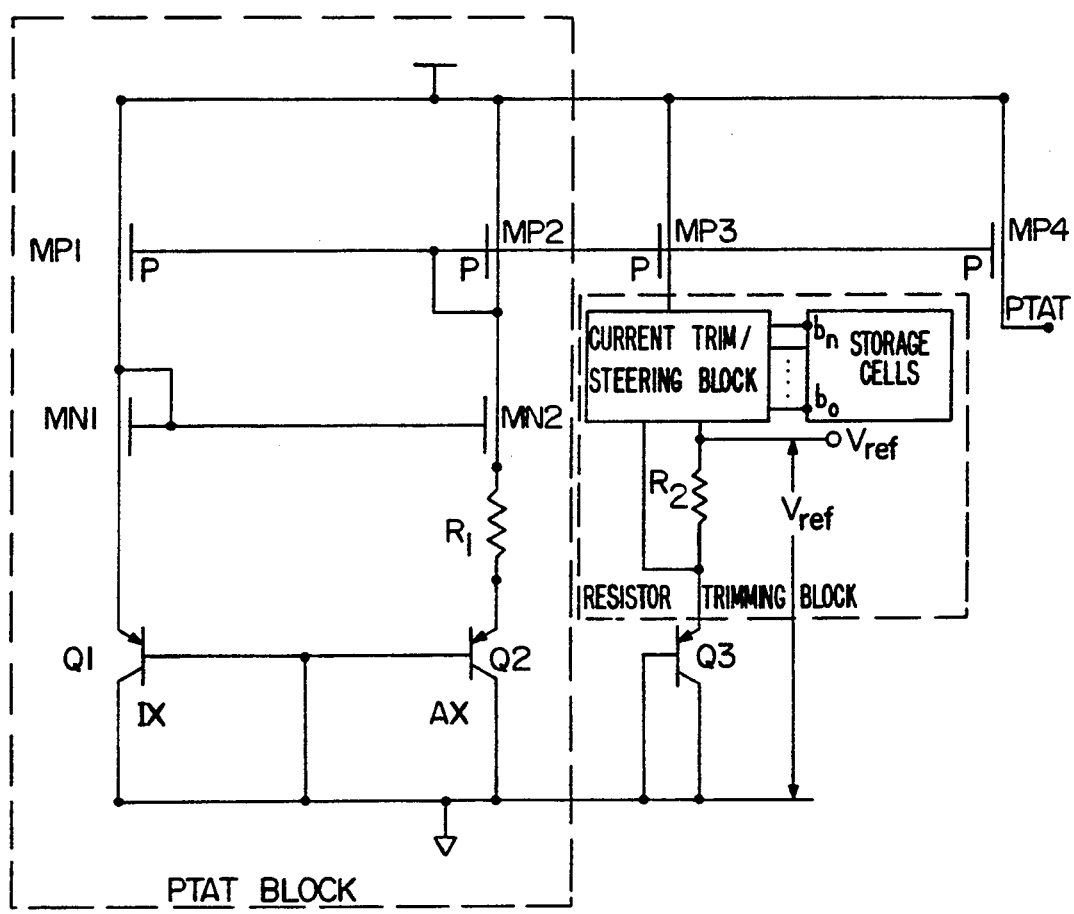
FIG. 7a is a block diagram for the temperature independent voltage source and PTAT current source used in the preferred embodiment of the present invention.

The temperature independent voltage source and PTAT current source block of FIG. 6, shown in detail in FIG. 7a, is essentially a bandgap reference generator. Bipolar devices Q1 and Q2 each carry the same current but operate at different current densities as a result of the device Q2 having an area A times the area of the device Q1. Thus device Q2 operates at a lower current density than Q1, with the result that the voltage difference between the emitter of Q1 and the emitter of Q2 is a voltage directly proportional to absolute temperature. This voltage appears across resistor R1, resulting in a current through R1 (and Q2 as well as Q1) which is proportional to absolute temperature. This current is mirrored by the device MP2, not only back to device MP1 to set the current in Q1, but also to devices MP3 and MP4, the latter device being proportioned to provide the PTAT current of appropriate scaling.

The current mirrored by device MP3 of FIG. 7a is applied to a resistor trimming block having two outputs connected to the resistor R2 and device Q3 as shown, with the voltage Vref appearing between the upper end of resistor R2 and the collector of Q3. The resistor trimming block utilizes a plurality of control bits b0 through bn (and their inverse signals) to control the current proportional to absolute temperature and to break the same into two components, one passing through resistor R2 and one passing around the resistor to the emitter of device Q3, the sum of the two components being constant and thus the current Q3 being constant (but of course proportional to absolute temperature) so that the voltage drop across resistor R2 may be varied, or more particularly, set as desired by the control bits. Since the voltage across transistor Q3, connected as a diode, will be a voltage having a substantial negative temperature coefficient, the voltage across resistor R2, which has a positive temperature coefficient, may be scaled by the control bits so that the reference voltage Vref is substantially temperature independent. Thus the control bits may be used to make up for manufacturing tolerances and variations properly proportion the positive temperature coefficient voltage across resistor R2 with respect to the negative coefficient voltage across Q3 to provide a Vref trimmed to be temperature independent, basically at one bandgap voltage. The control bits b0 through bn, and the inverse thereof provided through inverters (not shown), may be controlled in various ways. Obviously, the control bits may be basic inputs to the integrated circuit, allowing external control or even on the fly variation of Vref and its temperature coefficient. In the preferred embodiment, the control bits b0 through bn are set as desired by on-chip floating gate storage cells which are programmed by the device manufacturer, preferably using multiple purpose device connections so that once properly programmed by temporarily setting the device into a test or programming mode, the same connections may subsequently be used by the user as user input and/or output terminals.

Figure 7B:
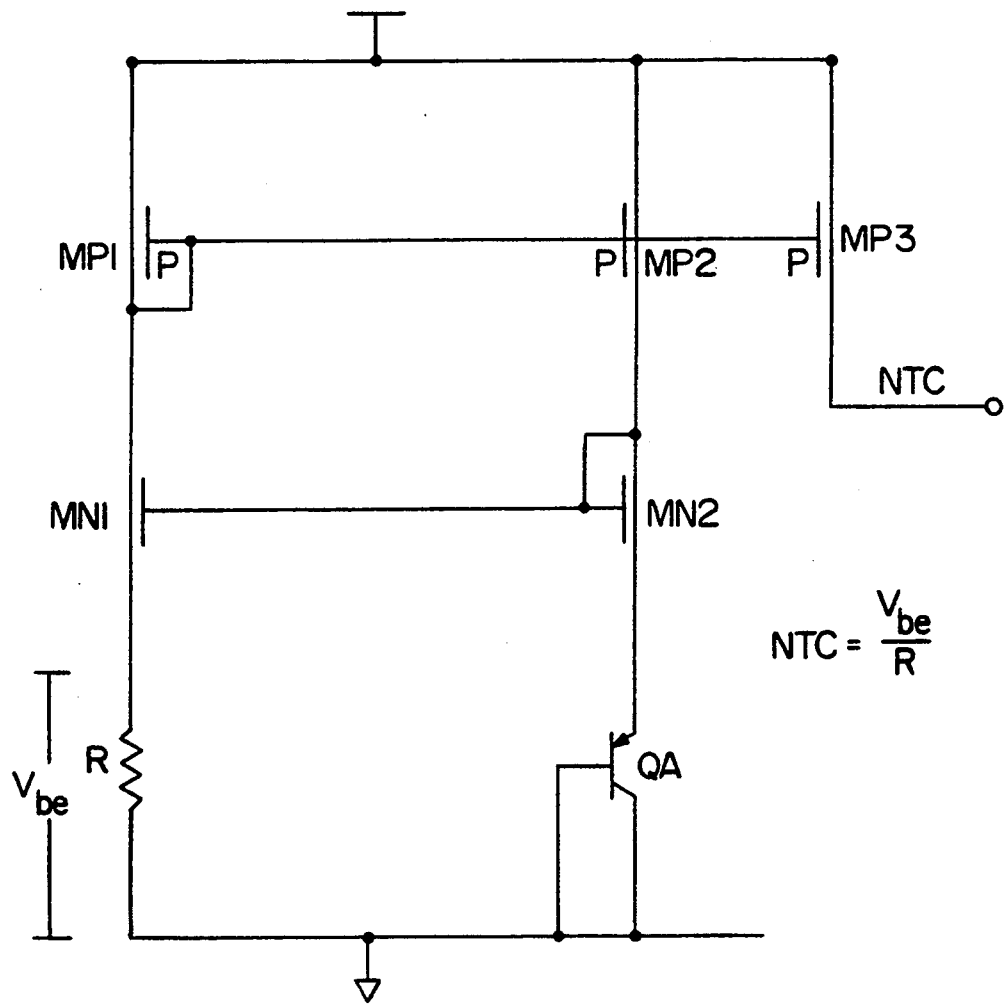
FIG. 7b is a circuit diagram for the negative temperature coefficient current generator used in the preferred embodiment of the present invention.
Figure 7C:
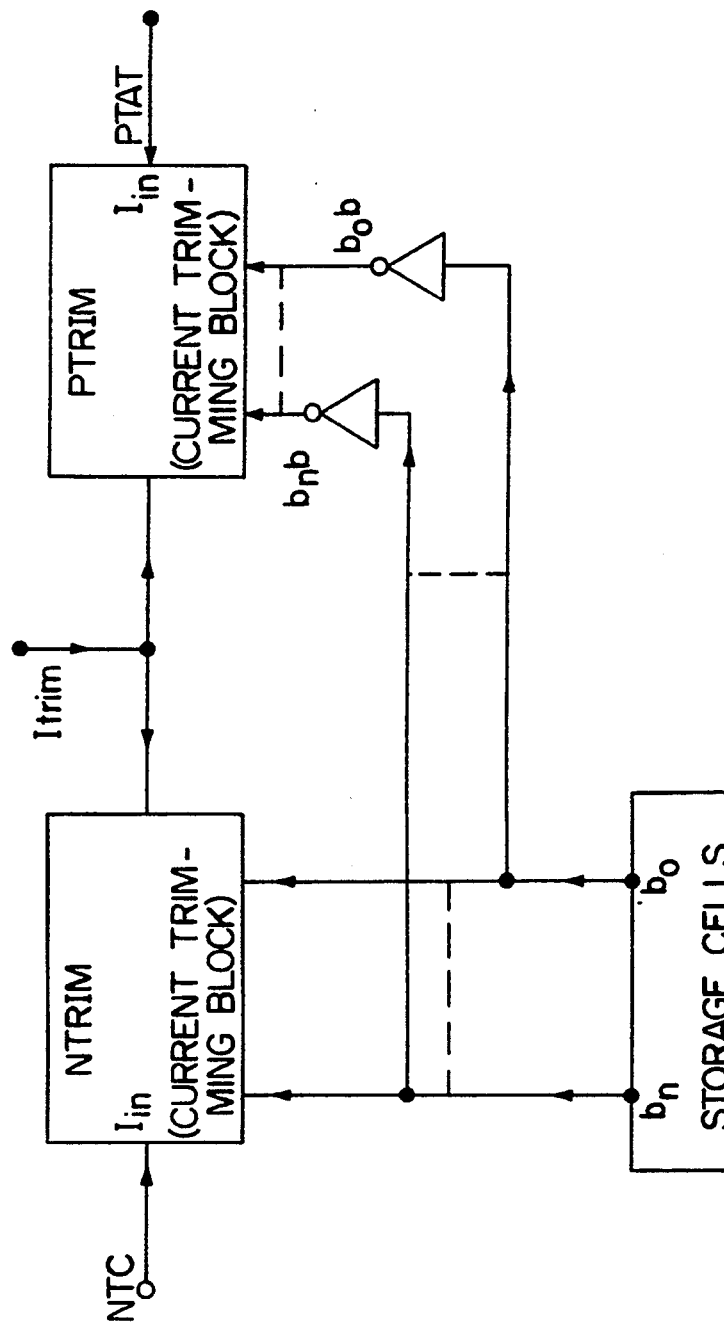
FIG. 7c is a circuit diagram for the temperature independent current generator used in the preferred embodiment of the present invention.
Figure 7D:
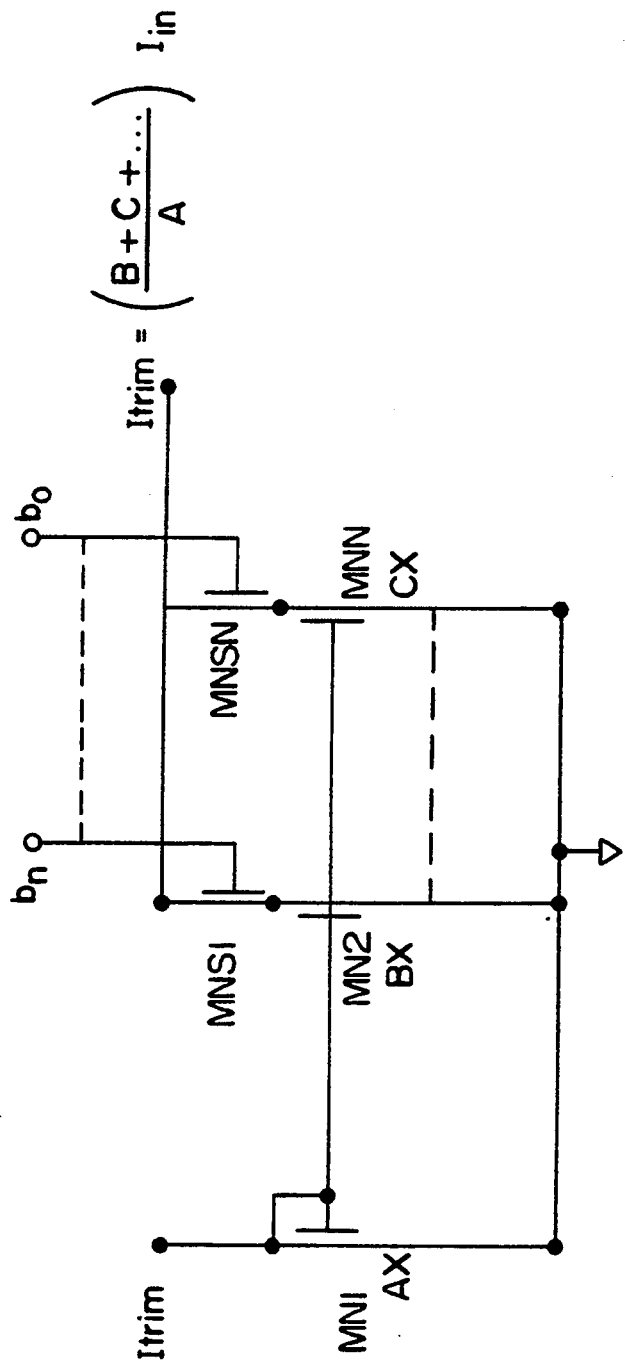
FIG. 7d is a circuit diagram for the current trimming block used in the preferred embodiment of the present invention.
Figure 7E:
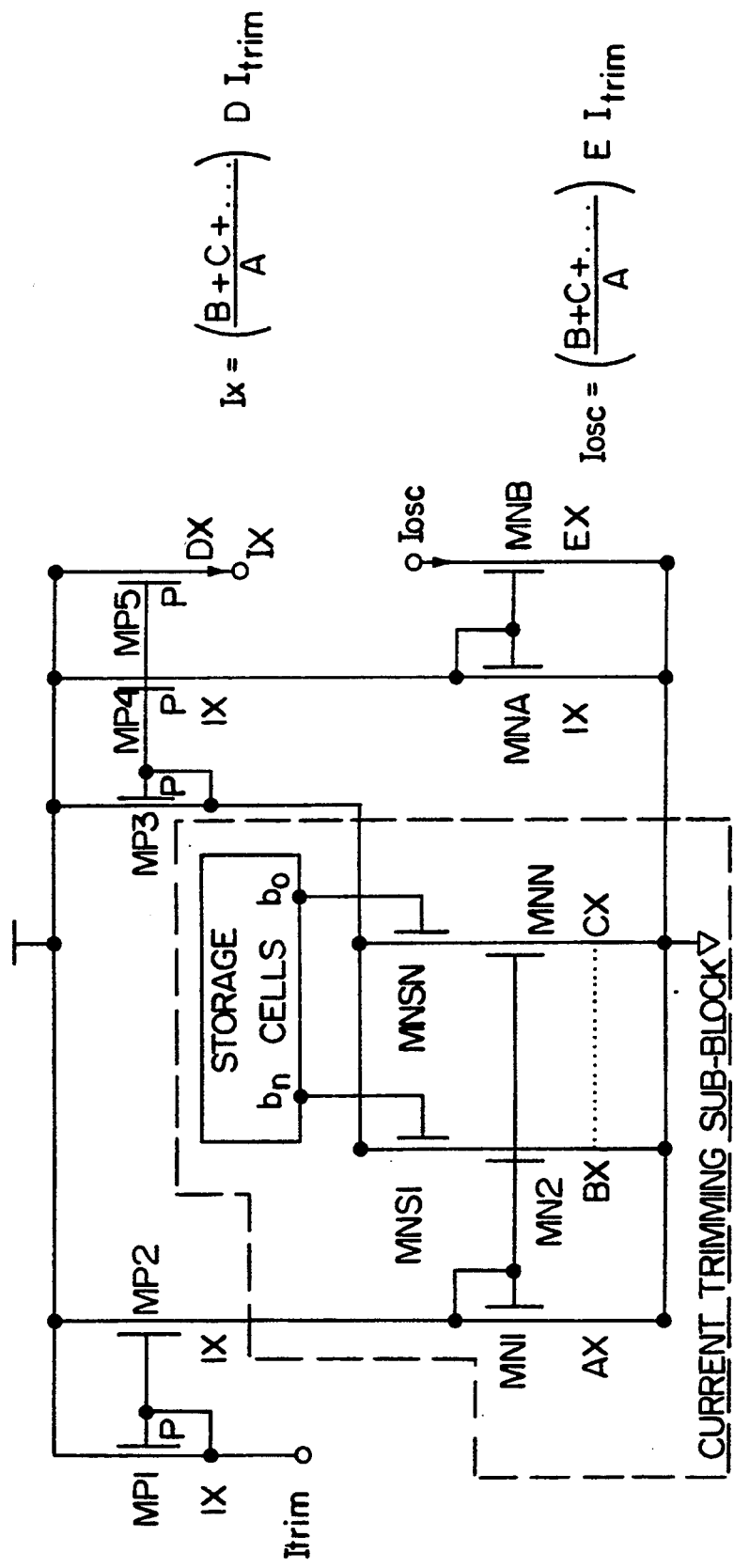
FIG. 7e is a circuit diagram for the tuning network used in the preferred embodiment of the present invention.
Figure 7F:
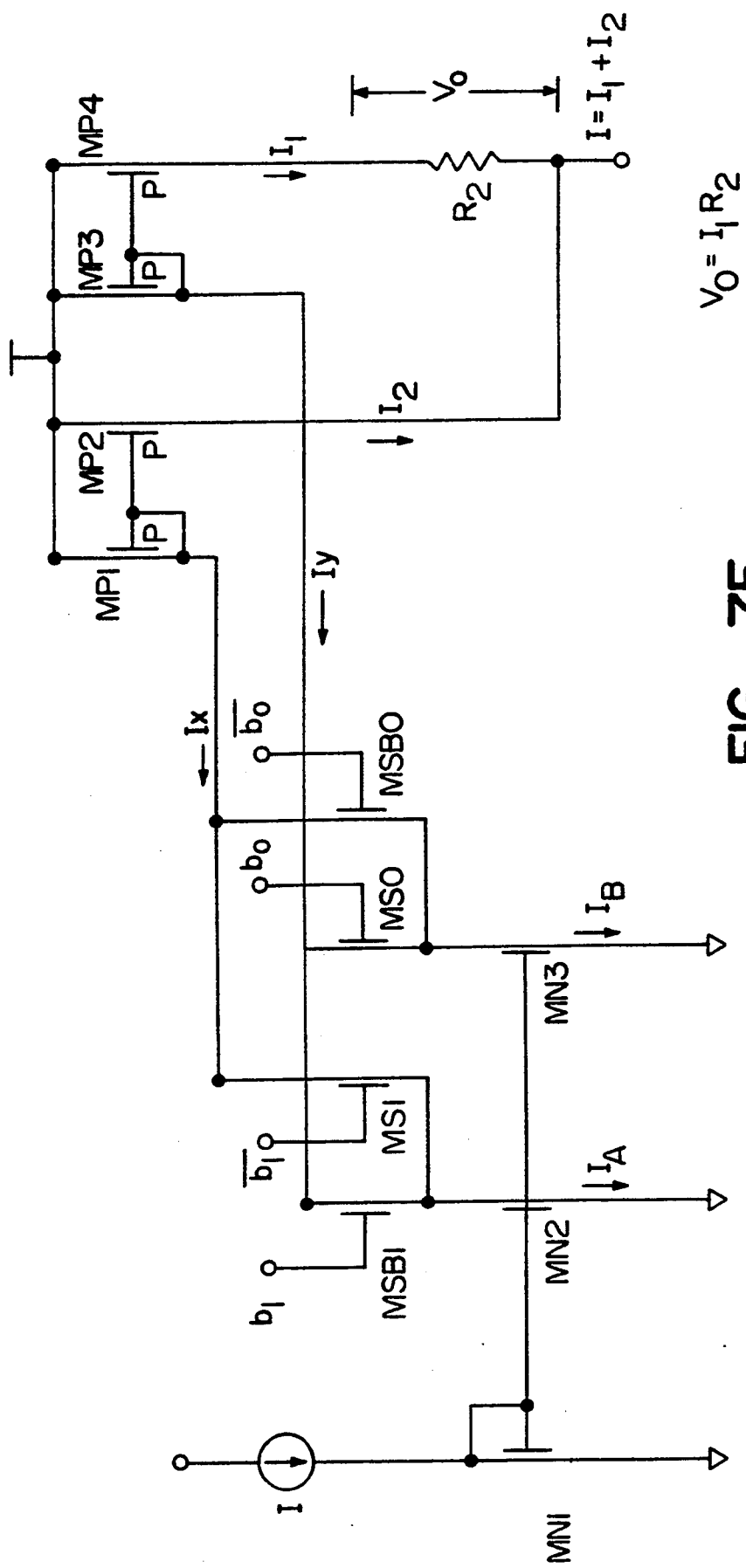
FIG. 7f is a circuit diagram for the resistor trimming block used in the preferred embodiment of the present invention.

A typical resistor trimming circuit is specifically illustrated in FIG. 7f. In particular, the current I (this is the current through device MP3 of FIG. 7a) is mirrored through device MN1 of FIG. 7f in appropriate proportions by devices MN2 and MN3. As to the current IA through device MN2, the same will be a component of Ix or Iy depending on which of devices MS1 or MSB1 is on. Thus the current IA will be mirrored by devices MP1 and MP2 to form a component of current I2 or alternatively will be mirrored by devices MP3 and MP4 to form a component of current I1. Similarly the current IB will be mirrored to provide a component of current I1 or of current I2 depending upon the state of bit b0. Obviously, while only two bits, namely bits b0 and b1 and t associated circuitry are illustrated in FIG. 7f, additional control bits may readily be added by merely duplicating three devices and the control connections thereof, such as devices MS0 MSB0 and MN3, to provide additional steerable current components IC, ID etc. Each current component, of course, could be equal, though it is more efficient to use a binary progression so that maximum trimmability may be achieved with minimum control bits.

It should be noted that the net effect of the trim circuit of FIG. 7a is to set the voltage drop across the resistor R2 for a given current through Q3, the element in series with the resistor. Changing the voltage drop across a resistor for a given current in an element in series therewith is equivalent to changing the resistance of the resistor. Thus the trim circuit of FIGS. 7a and 7f is electrically equivalent to changing the resistance of the resistor itself to accurately set the current to voltage transfer function as is done in the prior art by laser trimming techniques. However unlike laser trimming which must be done before the IC is packaged, which is irreversible, which requires mechanical alignment, etc., the trimming of the present invention can be done after packaging if so intended, can be changed and/or reversed, can be done as part of other electrical testing or trimming, etc., and therefore is easier, less expensive and conducive to better yields because of its changeability and reversibility.

The negative temperature coefficient current (NTC) generator of FIG. 6, shown in detail in FIG. 7b, creates the NTC current by forcing a voltage Vbe of a diode connected bipolar device across a resistor. Transistors MN1 and MN2 operate in a manner so as to force the Vbe onto the resistor R. Transistors MP1 and MP2 just mirror equal currents from each other, thereby causing the circuit to be self biased. Transistor MP3 mirrors the current NTC in the sourcing mode. Note that a completely complementary network is possible in which the N-channel transistors are swapped for the P-channel transistors and vice-versa and the bipolar transistor and the resistor referenced off the positive supply. The current NTC=Vbe/R. Being a self biased network, a start-up circuit (not shown) is essential with this network.

The temperature independent current generator of FIG. 6 is shown in block diagram form in FIG. 7c. The generator consists primarily of two current trimming blocks of the type shown in FIG. 7d, the difference between the two being that one operates on a set of control bits b0 through bn, and the other operates on the inverse thereof, both current trimming circuits taking an input current and providing an output current whose value depends on the setting of the trimming bits b0 through bn. Thus the NTRIM current trimming block receives the negative temperature coefficient current and provides a corresponding negative temperature coefficient current sink as controlled by the trim bits b0 through bn, whereas the PTRIM current trimming block receives the positive temperature coefficient current PTAT and provides a corresponding positive temperature current sink trimmed by the inverse bits $\overline{b0}$ through $\overline{bn}$. Thus through the trim bits the relative weighting of the negative temperature coefficient current and the positive temperature coefficient current may be adjusted, preferably through floating gate storage cells controlling the bits, to provide the temperature independent trim current.

The two current trimming blocks of FIG. 7c are shown in FIG. 7d (the two as stated before differing only by way of the control bits used). Transistors MN2 through MNN mirror the current Iin (NTC or PTAT) from MN1 with appropriate ratios. The ratioed mirrored currents are added to form Itrim through the N-channel transistor switches MNS1 through MNBN. For any particular N-channel switch which is off (the corresponding N-channel switch of the other current trimming block therefore being on), then that current ratio does not get added to Itrim. The number of bits used for trimming would depend on the resolution required for Itrim. Note also that an equivalent complementary network can be generated by swapping N-channel transistors for P-channel transistors. By using the current trimming block for generating suitable proportions of the PTAT and NTC currents and then adding the proportioned currents, it is possible to generate a temperature independent current. Using the trim bits to control one of the current trimming blocks, and complementary trim bits to control the other, equal components of the positive temperature coefficient current can be subtracted from Itrim as negative temperature coefficient current is added to Itrim, and vice versa. Of course, if desired, independent and separate trim bits could also be used for both current trimming blocks to give greater flexibility for trimming the temperature coefficient of Itrim, but more trim bits would be required, requiring either more storage cells for storing the trim information or requiring some other additional independent control.

FIG. 7e shows a circuit diagram for the tuning network of FIG. 6. This network utilizes the temperature independent current Itrim as its input and consists of a current trimming sub-block (like that of FIG. 7d) and some mirror transistors with proper ratios to generate the currents Iosc and Ix with the proper direction, e.g. sourcing and sinking. The trimming network used herein for the Itrim input current, while being temperature independent, may not be of the proper magnitude. Thus the trim bits b0 through bn are used to set the magnitude of the currents Iosc and Ix. Since the currents Iosc and Ix have a fixed ratio between them, readily repeatable by the fixed device geometry, only one set of trim bits are required to set the proper value for Iosc and Ix, with the fixed ratio therebetween automatically being maintained.

Thus the oscillator time-period is directly proportional to the filter time-constants. Hence, a control loop has been disclosed in which tuning is performed on-chip without any external components, by observing the on-chip oscillator frequency. At the same time, the filter time-constants are tuned automatically. Since tuning is inherent (the oscillator frequency and the filter characteristics automatically track each other), it is possible to vary the trimming to have different sampling rates in a sample-data system, as the control scheme is such that the clock to filter cutoff frequency ratio will remain the same, thereby satisfying the Nyquist criteria and avoiding effects of aliasing over the whole tunable range. Temperature and power supply independent tuning parameters have been used to generate oscillator frequency and filter cutoff characteristics tolerant to ambient changes. Also trimming of currents using the various current trim circuits of the present invention is in one case equivalent to changing the resistance of a resistor and in another case is a true current trim, and thus the trim capability is provided without requiring the use of prior art irreversible laser trimming techniques. In the claims to follow, no distinction is made between source and sink currents, as circuits may readily be made to generate or be responsive to either form of current.

While the preferred embodiment of the present invention has been disclosed and described herein, it will be obvious to those skilled in the art that various changes in form and detail may be made therein without departing from the spirit and scope thereof.

I claim:

1. A method of trimming the apparent current to voltage transfer function of a resistor comprising the steps of:
   providing a resistor for which the apparent current to voltage transfer function is to be varied;
   providing a conduction path parallel to the resistor;
   providing a first current on which the current to voltage transfer function of the resistor is to be based;
   providing means for generating a plurality of current components, each ratioed to the first current; and,
   steering selected ones of the current components through the resistor to provide the voltage drop thereacross for a desired apparent current to voltage transfer function of the resistor, wherein current components not passing through the resistor are passed through the conduction path, and wherein the total current passing through the parallel combination of the resistor and the conduction path has a fixed relation to the first current independent of a fraction thereof passing only through the resistor.

2. The method of claim 1 wherein the plurality of current components are of a relative magnitude corresponding approximately to a binary progression.

3. The method of claim 2 further comprising the steps of:
   providing controllable switch means for steering selected ones of the current components through the resistor and remaining current components through the parallel conduction path;
   providing programmable storage means for controlling the controllable switch means; and
   programming the programmable storage means to control the switch means to provide the desired apparent current to voltage transfer function of the resistor.

4. The method of claim 3 wherein the programmable storage means is a floating gate MOSFET storage means.

5. A method of trimming a current comprising the steps of:
   providing a first current having a fixed relationship to a desired trimmed current;
   providing means for generating a plurality of current components, each ratioed to the first current; and,
   summing selected ones of the current components to provide the desired trimmed current by
      providing controllable switch means for selecting which of the current components are to be summed,
      providing programmable storage means for controlling the controllable switch means, and
      programming the programmable storage means to control the switch means to sum the desired current components.

6. The method of claim 5 wherein the programmable storage means is a floating gate MOSFET storage means.

7. The method of claim 6 wherein the plurality of current components are of a relative magnitude corresponding approximately to a binary progression.

8. Apparatus for trimming the apparent current to voltage transfer function of a resistor comprising:
   a resistor for which the apparent current to voltage transfer function is to be varied;
   generating means for generating a first current on which the current to voltage transfer function of the resistor is to be based;
   ratioing means responsive to the generating means for generating a plurality of current components, each ratioed to the first current;
   a conduction path in parallel to the resistor; and,
   steering means for steering selected ones of the current components through the resistor to provide the voltage drop thereacross for the desired apparent current to voltage transfer function of the resistor and for steering the remaining ones of the current components through the parallel conduction path, with the desired apparent current to voltage transfer function of the resistor thereby obtained and also with the total current passing through the parallel combination of the resistor and the parallel conduction path having a fixed relation of the first current independent of a fraction thereof passing only through the resistor.

9. The apparatus of claim 8 wherein the plurality of current components are of a relative magnitude corresponding approximately to a binary progression.

10. The apparatus of claim 8 wherein the steering means comprises controllable switch means for steering selected ones of the current components through the resistor and the remaining current components through the parallel conduction path, and further comprising programmable storage means for controlling the controllable switch means.

11. The apparatus of claim 10 wherein the programmable storage means is a floating gate MOSFET storage means.

12. Apparatus for trimming a current comprising:
   means for generating a first current having a fixed relationship to the desired trimmed current;

means for generating a plurality of current components, each ratioed to the first current;

summing means for summing selected ones of the current components to provide a desired trimmed current;

controllable switch means for selecting which of the components are to be summed; and programmable storage means for controlling the controllable switch means to select predetermined components to be summed.

13. The apparatus of claim 12 wherein the programmable storage means is a floating gate MOSFET storage means.

14. The apparatus of claim 13 wherein the plurality of current components are of a relative magnitude corresponding approximately to a binary progression.

* * * * *